United States Patent
Chang et al.

(10) Patent No.: US 7,698,786 B2
(45) Date of Patent: Apr. 20, 2010

(54) DOOR HINGE PIN FOR PORTABLE ELECTRONIC DEVICE

(75) Inventors: Chih-Chiang Chang, Taipei Hsien (TW); Yung-Chang Yen, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 7 days.

(21) Appl. No.: 11/961,315

(22) Filed: Dec. 20, 2007

(65) Prior Publication Data
US 2009/0094790 A1    Apr. 16, 2009

(30) Foreign Application Priority Data
Oct. 12, 2007  (CN) .................. 2007 1 0202052

(51) Int. Cl.
*E05D 5/10* (2006.01)
(52) U.S. Cl. .................. 16/386; 455/575.3; 379/433.13
(58) Field of Classification Search .................. 16/386, 16/254, 373; 455/575.3; 379/433.13; 361/681, 361/679.27
See application file for complete search history.

(56) References Cited

U.S. PATENT DOCUMENTS

| | | | | |
|---|---|---|---|---|
| 75,903 A * | 3/1868 | Hauck | .......................... | 16/386 |
| 1,021,885 A * | 4/1912 | Petersen | ...................... | 16/262 |
| 4,366,599 A * | 1/1983 | Zimmer et al. | .................. | 16/386 |
| 4,841,599 A * | 6/1989 | Cebollero | ..................... | 16/297 |
| 5,645,133 A * | 7/1997 | Thompson et al. | ........ | 180/69.21 |
| 6,807,712 B2 * | 10/2004 | Maatta | .......................... | 16/331 |

* cited by examiner

*Primary Examiner*—William L. Miller
(74) *Attorney, Agent, or Firm*—Steven M. Reiss

(57) ABSTRACT

A door hinge pin (20) for a portable electronic device (900) is provided. The door hinge pin includes a lead pin portion (201), a first pin body portion (202), a second pin body portion (204), a third pin body portion (203), and a tail pin portion (205), which connect with each other in such described order. The lead pin portion and the tail pin portion are respectively positioned substantially vertical to the first pin body portion and the third pin body portion. The first pin body portion is located in parallel with the third pin body portion. The first connecting pin portion is unsymmetrical with the second connecting pin portion about a first reference line X1. The first reference line X1 is defined parallel to the first pin body portion and the third pin body portion and located therebetween. Distance spaced between the first reference line X1 and the first pin body portion is substantially the same as that spaced between the first reference line X1 and the third pin body portion.

7 Claims, 5 Drawing Sheets

100
DOOR HINGE PIN FOR PORTABLE ELECTRONIC DEVICE

BACKGROUND OF THE INVENTION

1. Field of the Invention

The present invention relates to door hinge pins, particularly to a door hinge pin used in portable electronic device.

2. Description of Related Art

With development of technology, portable electronic device (e.g., mobile phone or personal digital handset) has been developing more and more user-friendly functions therewith, e.g., the imaging function, the music playback function, and etc. With respect to that, storage module of the portable electronic device requires additional storage space to facilitate working of such functions.

To meet such requirement, a supplemental storage card is typically used for storing information therein, such as images, sounds and etc. and inserted into a receiving groove defined in the portable electronic device. A storage door is hinged with the portable electronic device via a door hinge pin for enclosing the receiving groove. When the receiving groove is close to the storage door, the storage card is further retained in the receiving groove.

As shown in FIG. 5, the typical door hinge pin 10 includes a lead pin portion 101, a first pin body portion 102, a second pin body portion 103, a third pin body portion 104, and a tail pin portion 105, which connects with each other, in the order written. The lead pin portion 101 and the tail pin portion 105 are respectively positioned substantially vertical to the first pin body portion 102 and the third pin body portion 104. The lead pin portion 101 and the tail pin portion 105 are each located in parallel with the second pin body portion 103. The distance (i.e., dimensioned as L1) between the lead pin portion 101 and the second pin body portion 103 differs in a minor extent from that (i.e., dimensioned as L2) of the tail pin portion 105 and the second pin body portion 103.

In assembly, the door hinge pin 10 needs to be assembled within the portable electronic device. For minor difference between the distances L1 and L2, which is relatively difficult to distinguish, operators tend to make mistakes during the assembly process. Additional operation may be required to correct the mistakes made by the operators. Thus, manufacturing cost is inevitably increased.

Therefore, a heretofore-unaddressed need exists in the art to address the aforementioned deficiencies and inadequacies.

SUMMARY

In present aspect, a door hinge pin for a portable electronic device is provided. The door hinge pin includes a lead pin portion, a first pin body portion, a second pin body portion, a third pin body portion, and a tail pin portion, which connect with each other in the order written. The lead pin portion and the tail pin portion are respectively positioned substantially vertical to the first pin body portion and the third pin body portion. The first pin body portion is located in parallel with the third pin body portion. The first connecting pin portion is unsymmetrical with the second connecting pin portion about a first reference line. The first reference line is defined parallel to the first pin body portion and the third pin body portion and located therebetween. Distance spaced between the first reference line and the first pin body portion is substantially the same as that spaced between the first reference line and the third pin body portion.

In another aspect, a portable electronic device has the present door hinge pin assembled therewith is provided. The portable electronic device further includes a base body and a storage door. The base body includes a lower wall and a sidewall, and has a receiving groove defined therein. The sidewall has an opening defined therethrough communicating with the receiving groove. The storage door is hinged with the door hinge pin and configured for covering the opening. The lower wall has a mounting groove defined therein. The mounting groove corresponds to the door hinge pin and is configured for receiving the door hinge pin therein.

These and other aspects of the present invention will become more apparent from the following detailed description of the preferred embodiments taken in conjunction with the accompanying drawings, although variations and modifications therein may be affected without departing from the spirit and scope of the novel concepts of the disclosure.

BRIEF DESCRIPTION OF THE DRAWINGS

Many aspects of the present a door hinge pin for a portable electronic device can be better understood with reference to the following drawings. These drawings are not necessarily drawn to scale, the emphasis instead being placed upon clearly illustrating the principles of the present door hinge pin for the portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

The present door hinge pin for the portable electronic device is described here in conjunction with the accompanying drawings in FIGS. 1 through 4. The door hinge pin is suitably assembled within the portable electronic device for hinging a storage door of a storage module therewith. The portable electronic device can be a mobile phone, a personal digital handset, or the like.

Figure 1:
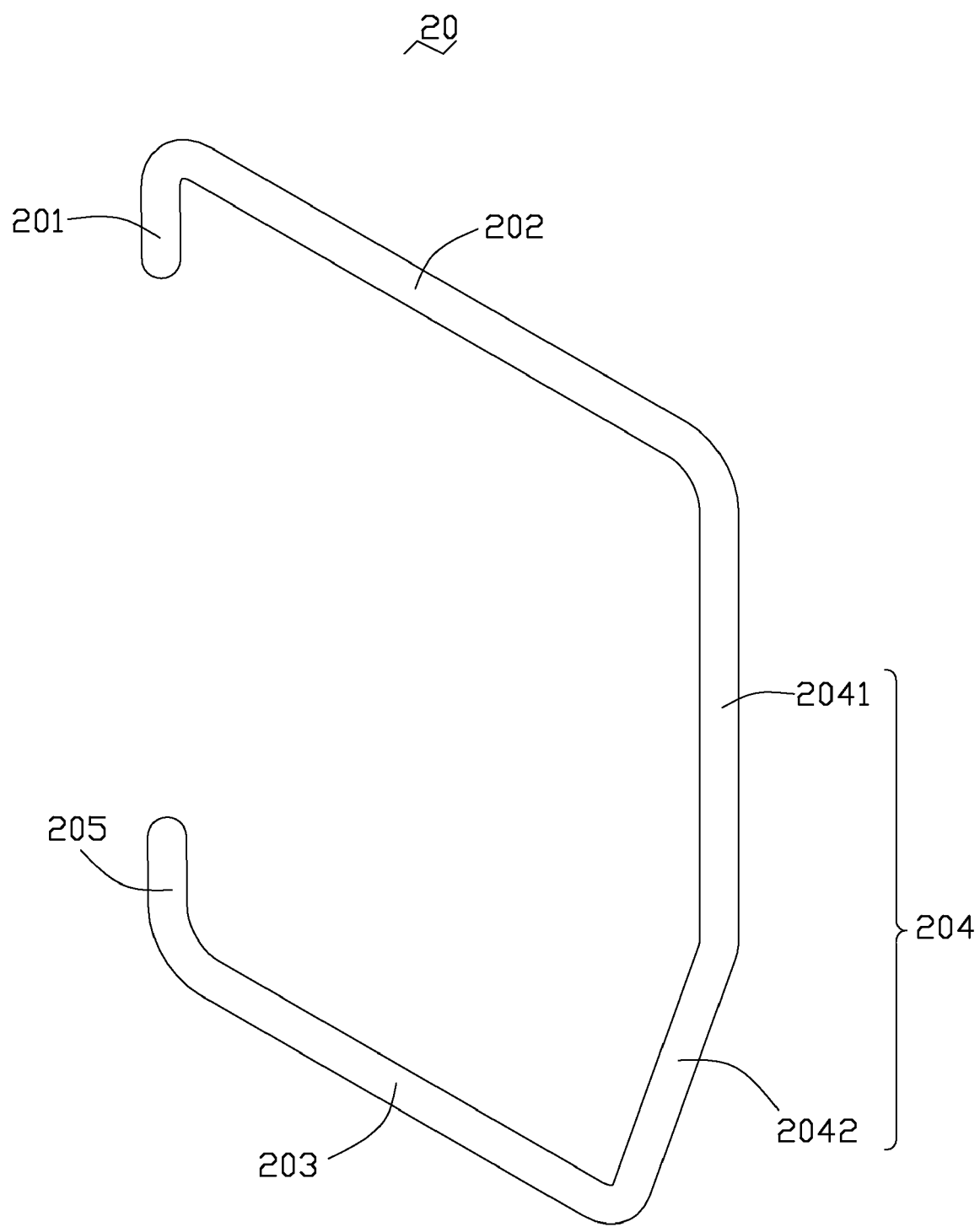
FIG. 1 is an isometric view of a door hinge pin in accordance with a present embodiment.
Figure 2:
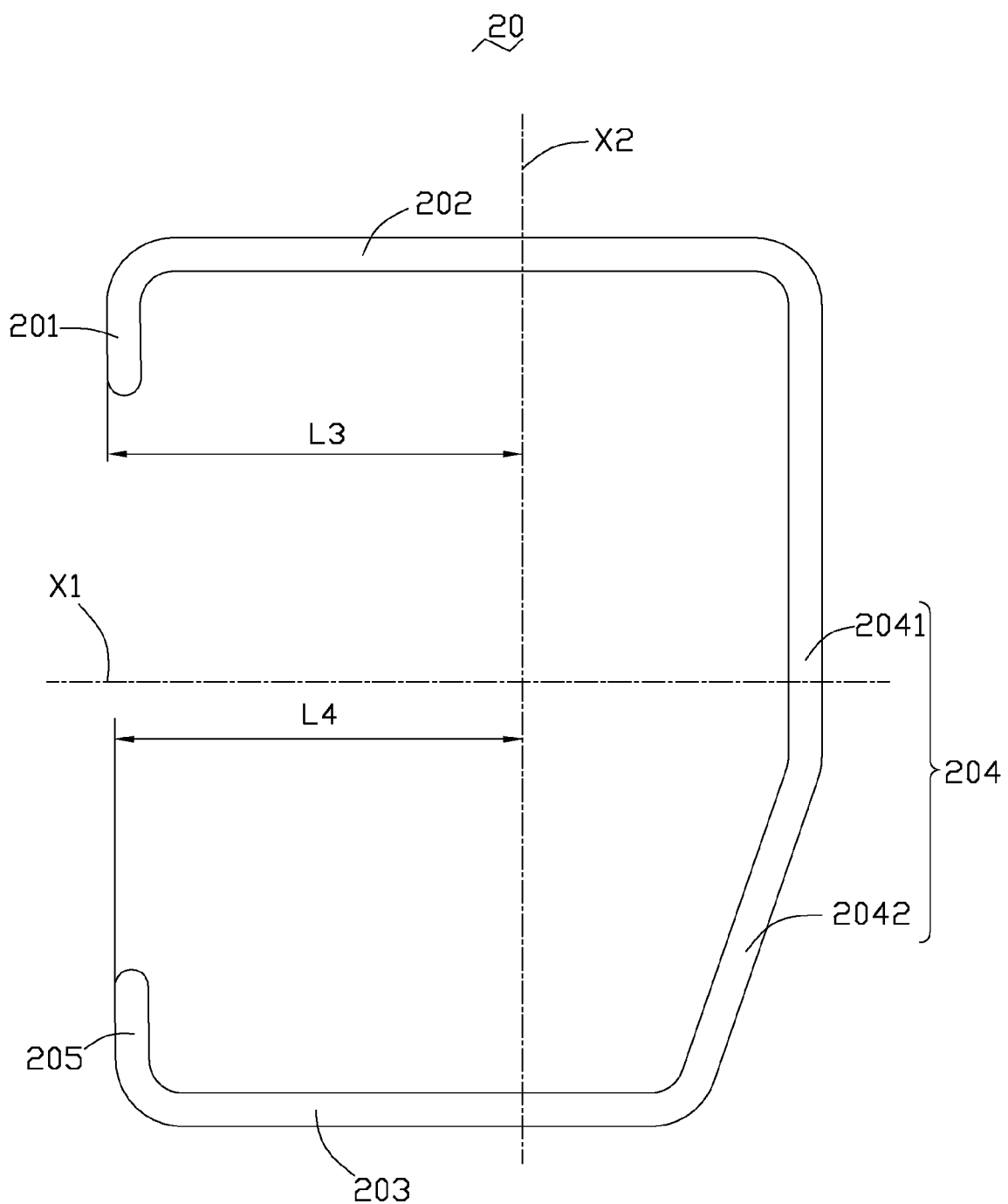
FIG. 2 is a plane view of the door hinge pin shown in FIG. 1.

Referring to FIGS. 1 and 2, the door hinge pin 20 includes a lead pin portion 201, a first pin body portion 202, a second pin body portion 204, a third pin body portion 203, and a tail pin portion 205, which connects with each other in the order written. That is, the lead pin portion 201 is connected with the first pin body portion 202 which is connected with the second pin body portion 204 which is connected with the third pin body portion 203 which is connected with the tail pin portion 205. The lead pin portion 201 and the tail pin portion 205 are respectively positioned substantially vertical to the first pin body portion 202 and the third pin body portion 203. The first pin body portion 202 is located in parallel with the third pin body portion 203.

In order to better describe and illustrate the present door hinge pin 20, two reference lines X1 and X2 are defined/illustrated in such a manner as shown in FIG. 2. That is, the reference line X1 is defined parallel to the first pin body portion 202 and the third pin body portion 203 and located therebetween. Distance spaced between the reference line X1 and the first pin body portion 202 is substantially the same as that spaced between the reference line X1 and the third pin body portion 203. The reference line X2 is defined orthogonal to the reference line X1 and intersects the first pin body portion 202 and the third pin body portion 203.

The distance between the lead pin portion 201 and the reference line X2 along reference line X1, is dimensioned as L3. The distance, which is between the tail pin portion 205 and the reference line X2 along reference line X1, is dimensioned as L4. The L4 is advantageously a bit longer than the L3 in length.

The second pin body portion 204 has a first connecting pin portion 2041 and a second connecting pin portion 2042 connected therewith. The first connecting pin portion 2041 is advantageously unsymmetrical with the second connecting pin portion 2042 about the reference line X1. The second connecting pin portion 2042 advantageously has an end connecting with the third pin body portion 203 in an obtuse angle and an opposite end connecting with the first connecting pin portion 2041 in another obtuse angle. The first connecting pin portion 2041 further perpendicularly connects with the second pin body portion 204.

Figure 3:
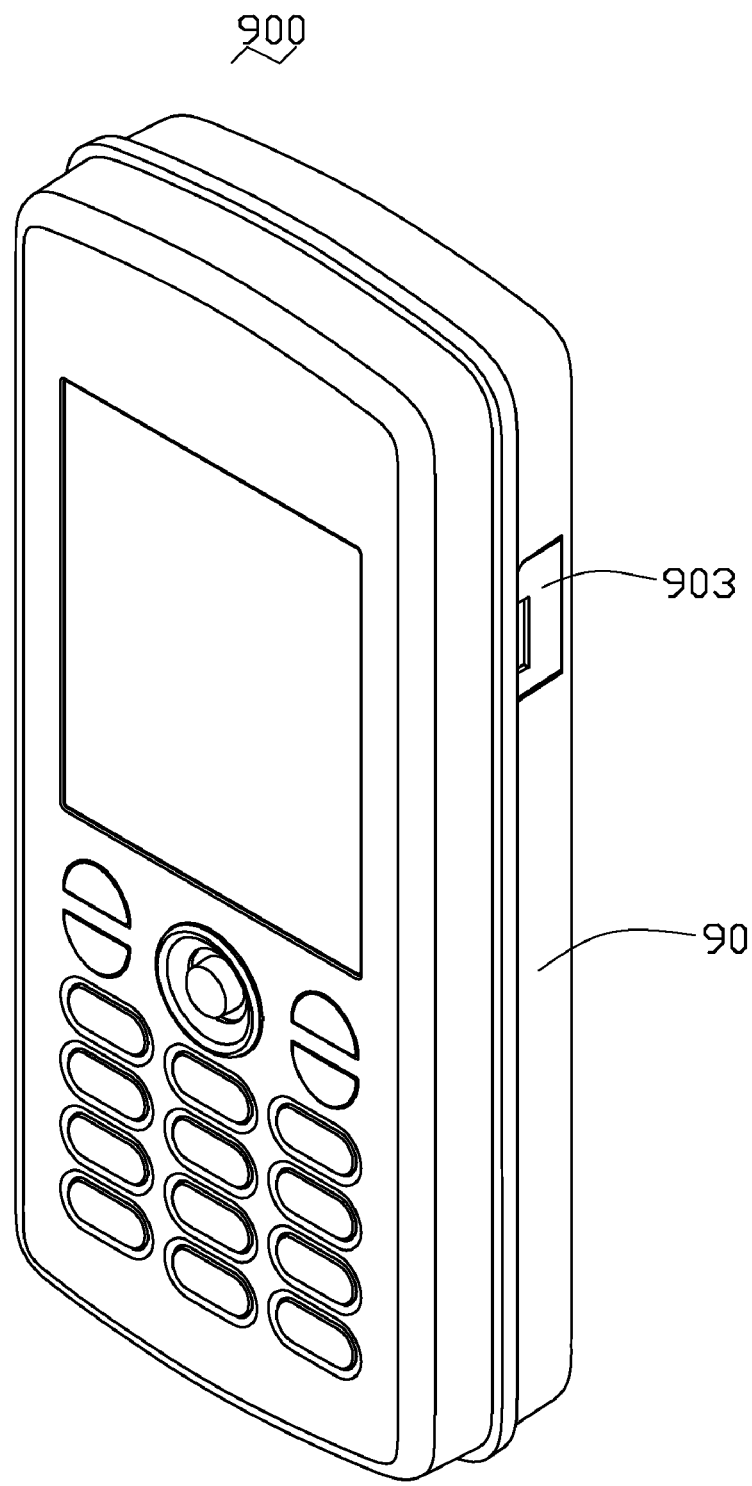
FIG. 3 is an isometric view of a portable electronic device incorporating the door hinge pin shown in FIG. 1.
Figure 4:
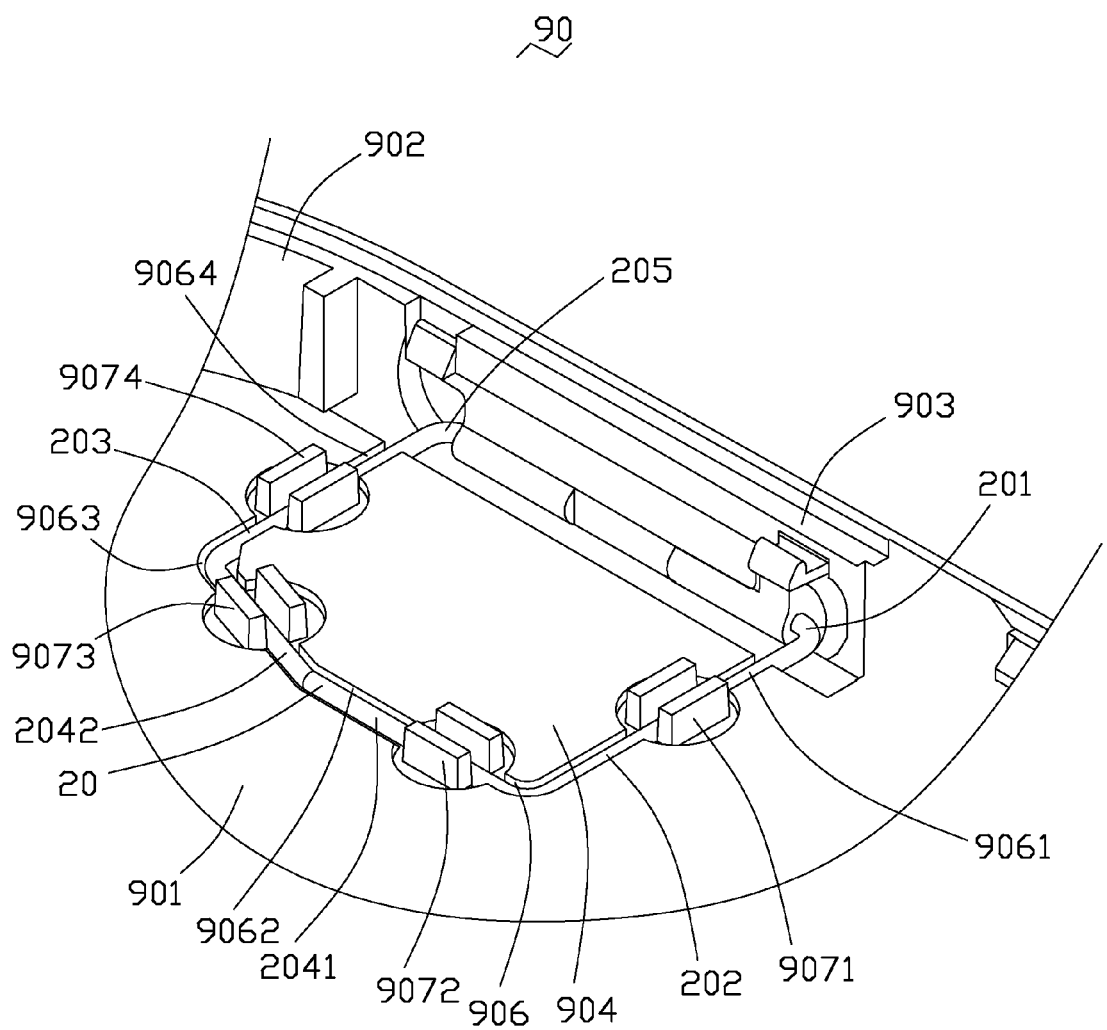
FIG. 4 is an enlarged, partial and isometric view of the door hinge pin shown in FIG. 1 as assembled within the portable electronic device as shown in FIG. 3.
Figure 5:
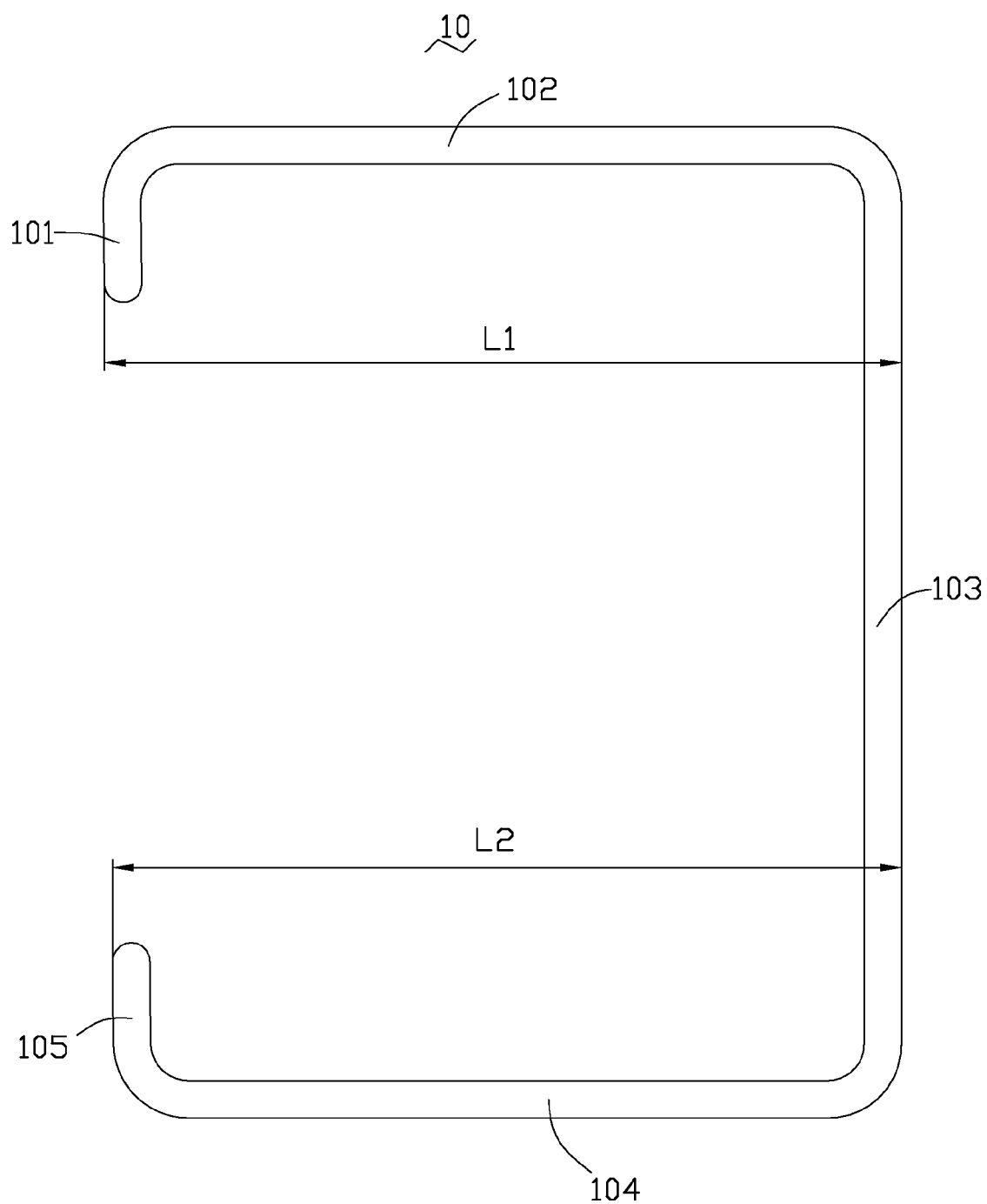
FIG. 5 is a planar view of a typical door hinge pin.

Referring further to FIG. 3 and FIG. 4, a mobile phone 900 is exemplified to illustrate the principles of the present door hinge pin 20 as assembled within the mobile phone 900. The mobile phone 900 includes a base body 90. The base body 90 includes a lower wall 901 and a sidewall 902 and defines a receiving groove 904 therein. The sidewall 902 has an opening (not labeled) defined therethrough and the opening communicates with the receiving groove 904. A storage card (not shown) can be inserted through the opening and engages into the receiving groove 904. A storage door 903 is further hinged with the mobile phone 900 via engagement with the door hinge pin 20 and configured (e.g., structured or arranged) for covering the opening and facilitating retaining the storage card within the receiving groove 904.

The lower wall 901 of the base body 90 has a mounting groove 906 defined therein and a plurality of mounting boards formed thereon. The mounting groove 906 corresponds to the door hinge pin 20 and is configured for receiving the door hinge pin 20 therein. The mounting groove 906 includes a first connecting groove 9061, a second connecting groove 9062, a third connecting groove 9063, and a fourth connecting groove 9064. The first connecting groove 9061 corresponds to the first pin body portion 202 of the door hinge pin 20 and is configured for receiving the first pin body portion 202 therein. The second connecting groove 9062 corresponds to the first connecting pin portion 2041 of the second pin body portion 204 of the door hinge pin 20 and is configured for receiving the first connecting pin portion 2041 therein. The third connecting groove 9063 corresponds to the second connecting pin portion 2042 of the second pin body portion 204 of the door hinge pin 20 and is configured for receiving the second connecting pin portion 2042 therein. The fourth connecting groove 9064 corresponds to the third pin body portion 203 of the door hinge pin 20 and is configured for receiving the third pin body portion 203 therein.

The mounting boards are generally rectangular-shaped and include two first mounting boards 9071, two second mounting boards 9072, two third mounting boards 9073, and two fourth mounting boards 9074. The two first mounting boards 9071 are respectively formed on the two sides of the first connecting groove 9061. The two second mounting boards 9072 are respectively formed on the two sides of the second connecting groove 9062. The two third mounting boards 9073 are respectively formed on the two sides of the third connecting groove 9063. The two fourth mounting boards 9074 are respectively formed on the two sides of the fourth connecting groove 9064.

The storage door 903 advantageously has two hinge holes (not labeled) defined in two ends thereof. The lead pin portion 201 and the tail pin portion 205 respectively engage into the two hinge holes. The storage door 903 is thus hinged with the door hinge pin 20 as assembled within the mobile phone 900. The storage door 903 can be operated as to open or close the opening for inserting/extracting or retaining the storage card within the receiving groove 904.

In assembling the door hinge pin 20 within the mobile phone 900, the lead pin portion 201 and the tail pin portion 205 respectively engage into the two hinge holes of the storage door 903. The door hinge pin 20 is placed into the mounting groove 906 with the first pin body portion 202, the first connecting pin portion 2041 of the second pin body portion 204, the second connecting pin portion 2042 of the second pin body portion 204, and the third pin body portion 203 respectively engaging into the first, second, third, and fourth connecting grooves 9061, 9062, 9063, and 9064.

After that, the door hinge pin 20 is attached (e.g., sweating soldered) with the mounting boards via respectively attaching the first pin body portion 202, the first connecting pin portion 2041, the second connecting pin portion 2042, and the third pin body portion 203 with the first, second, third, and fourth mounting boards 9071, 9072, 9073, and 9074. The door hinge pin 20 combined with the storage door 903 is thus assembled within the mobile phone 900.

It is understood that the second pin body portion 204 can otherwise have different structure from that structure as shown in FIGS. 1 and 2 in such a manner that the first connecting pin portion 2041 is unsymmetrical with the second connecting pin portion 2042 about the reference line X1. For example, the second connecting pin portion 2042 has an end connecting with the third pin body portion 203 in an obtuse angle and an opposite end connecting with the first connecting pin portion 2041 in an acute angle. The first connecting pin portion 2041 further perpendicularly connects with the second pin body portion 204.

One main advantage of the present embodiments embodies that the present structure of the door hinge pin 20, i.e., the first connecting pin portion 2041 is unsymmetrical with the second connecting pin portion 2042 about the reference line X1. During assembly process, an operator may mistakenly invert the proper assembling order of the lead pin portion 201 and the tail portion 205. At such times, the door hinge pin 20 will interfere with the mounting groove 906 and the mounting boards. Thus, the present structure of the door hinge pin 20 is convenient for an operator to properly, rapidly identify the lead pin portion 201 and the tail pin portion 205. The present structure of the door hinge pin 20 can also allow operator to properly and rapidly assemble the door hinge pin 20 with the storage door 903 and assemble within the mobile phone 900. The manufacturing cost is therefore decreased.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A door hinge pin for a portable electronic device, comprising:
  a lead pin portion;
  a first pin body portion;
  a second pin body portion;
  a third pin body portion; and
  a tail pin portion;
  wherein the lead pin portion is connected with the first pin body portion which is connected with the second pin body portion which is connected with the third pin body portion which is connected with the tail pin portion, the lead pin portion and the tail pin portion are respectively positioned substantially vertical to the first pin body portion and the third pin body portion, the first pin body portion is located in parallel with the third pin body portion, a first reference line is defined parallel to the first pin body portion and the third pin body portion and located therebetween, and a first distance spaced between the first reference line and the first pin body portion is substantially the same as a second distance spaced between the first reference line and the third pin body portion, a second reference line is defined orthogonal to the first reference line, the distance between the tail pin portion and the second reference line along the first reference line is different from the distance between the head pin portion and the second reference line along the first reference line, and wherein the second pin body portion has a first connecting pin portion and a second connecting pin portion, the first connecting pin portion connecting with the first pin body portion, the second connecting pin portion connecting with the third pin body portion, and the first connecting pin portion being structured and arranged to be unsymmetrical with the second connecting pin portion about the first reference line.

2. The door hinge pin as claimed in claim 1, wherein the second connecting pin portion has an end connecting with the third pin body portion in an obtuse angle and an opposite end connecting with the first connecting pin portion in another obtuse angle, and the first connecting pin portion perpendicularly connects with the first pin body portion.

3. A portable electronic device including the door hinge pin as claimed in claim 1, comprising:
  a base body including a lower wall and a sidewall and having a receiving groove defined therein, the sidewall having an opening defined therethrough communicating with the receiving groove;
  a storage door hinged with the door hinge pin and configured for covering the opening;
  wherein the lower wall has a mounting groove defined therein, the mounting groove corresponds to the door hinge pin and is configured for receiving the door hinge pin therein.

4. The portable electronic device as claimed in claim 3, wherein the lower wall further has a plurality of mounting boards formed thereon configured for attaching the door hinge door pin therewith.

5. The portable electronic device as claimed in claim 4, wherein the mounting groove includes a first connecting groove, a second connecting groove, a third connecting groove, and a fourth connecting groove, the first connecting groove corresponds to the first pin body portion, the second connecting groove corresponds to the first connecting pin portion, the third connecting groove corresponds to the second connecting pin portion, and the fourth connecting groove corresponds to the third pin body portion.

6. The portable electronic device as claimed in claim 5, wherein the mounting boards include two first mounting boards, two second mounting boards, two third mounting boards, and two fourth mounting boards, the two first mounting boards are respectively formed on the two sides of the first connecting groove, the two second mounting boards are respectively formed on the two sides of the second connecting groove, the two third mounting boards are respectively formed on the two sides of the third connecting groove, and the two fourth mounting boards are respectively formed on the two sides of the fourth connecting groove.

7. The portable electronic device as claimed in claim 3, wherein the storage door has two hinge holes defined in two ends thereof, and the lead pin portion and the tail pin portion respectively engage into the two hinge holes.

* * * * *